United States Patent
Goktepeli (10) Patent No.: US 9,704,738 B2
(45) Date of Patent: Jul. 11, 2017

(54) BULK LAYER TRANSFER WAFER WITH MULTIPLE ETCH STOP LAYERS

(71) Applicant: QUALCOMM Incorporated, San Diego, CA (US)

(72) Inventor: Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 14/740,505

(22) Filed: Jun. 16, 2015

(65) Prior Publication Data

US 2016/0372364 A1  Dec. 22, 2016

(51) Int. Cl.
| | | |
|---|---|---|
| *H01L 21/762* | (2006.01) | |
| *H01L 21/78* | (2006.01) | |
| *H01L 21/304* | (2006.01) | |
| *H01L 21/306* | (2006.01) | |
| *H01L 21/56* | (2006.01) | |
| *H01L 23/522* | (2006.01) | |
| *H01L 29/06* | (2006.01) | |

(52) U.S. Cl.
CPC ...... *H01L 21/76256* (2013.01); *H01L 21/304* (2013.01); *H01L 21/30604* (2013.01); *H01L 21/561* (2013.01); *H01L 21/78* (2013.01); *H01L 23/5226* (2013.01); *H01L 29/0649* (2013.01)

(58) Field of Classification Search
CPC ........... H01L 21/76256; H01L 23/5226; H01L 29/0649
USPC ........ 257/506; 438/459, 106, 118, 700, 702, 438/690, 691
See application file for complete search history.

(56) References Cited

U.S. PATENT DOCUMENTS

| | | | |
|---|---|---|---|
| 5,071,792 A | 12/1991 | VanVonno et al. | |
| 5,185,292 A * | 2/1993 | VanVonno | ........ H01L 21/30604 |
| | | | 257/E21.219 |
| 5,395,481 A | 3/1995 | McCarthy | |
| 5,591,678 A | 1/1997 | Bendik et al. | |
| 7,358,152 B2 | 4/2008 | Kub et al. | |
| 7,955,969 B2 | 6/2011 | Kinzer et al. | |
| 8,466,036 B2 | 6/2013 | Brindle et al. | |
| 9,318,368 B2 * | 4/2016 | Chang | ............... H01L 21/76229 |
| 2003/0223722 A1 * | 12/2003 | Sugita | ...................... G02B 6/13 |
| | | | 385/129 |

(Continued)

OTHER PUBLICATIONS

International Search Report and Written Opinion—PCT/US2016/032540—ISA/EPO—Aug. 4, 2016.

(Continued)

*Primary Examiner* — Victoria K Hall
(74) *Attorney, Agent, or Firm* — Haynes and Boone, LLP (57) ABSTRACT

Bonded semiconductor device structures and device structure fabrication processes to obviate the need for SOI wafers in many device fabrication applications are disclosed. In some examples, multiple etch stop layers are formed in situ during fabrication of an active device structure on a bulk semiconductor wafer. The etch stop layers are incorporated into in a layer transfer process to enable very thin high quality active device layers of substantially uniform across-wafer thickness to be separated from bulk semiconductor wafers and bonded to handle wafers. As a result, these examples can produce high-performance and low-power semiconductor devices while avoiding the high cost of SOI wafers.

22 Claims, 9 Drawing Sheets

(56) References Cited

U.S. PATENT DOCUMENTS

| | | | | |
|---|---|---|---|---|
| 2005/0280120 | A1* | 12/2005 | Tomita | H01L 23/522 257/620 |
| 2007/0040235 | A1* | 2/2007 | Chan | H01L 21/76229 257/510 |
| 2007/0218645 | A1* | 9/2007 | Zhou | H01L 21/76229 438/427 |
| 2009/0160050 | A1* | 6/2009 | Miyakawa | H01L 21/76898 257/737 |
| 2010/0216291 | A1* | 8/2010 | Lee | H01L 21/28114 438/270 |
| 2011/0312172 | A1* | 12/2011 | Park | H01L 21/3086 438/594 |
| 2012/0264259 | A1 | 10/2012 | Hirler et al. | |
| 2013/0075796 | A1* | 3/2013 | Tsai | H01L 21/76224 257/288 |
| 2013/0115724 | A1 | 5/2013 | Kearl et al. | |
| 2013/0146962 | A1* | 6/2013 | Ahn | H01L 27/11568 257/316 |
| 2013/0334607 | A1* | 12/2013 | Fumitake | H01L 21/76229 257/368 |
| 2014/0145272 | A1* | 5/2014 | Or-Bach | H01L 27/0688 257/369 |
| 2014/0159193 | A1* | 6/2014 | Kim | H01L 29/0649 257/513 |
| 2014/0291741 | A1* | 10/2014 | Tsai | H01L 27/088 257/288 |
| 2015/0179505 | A1 | 6/2015 | Stuber et al. | |
| 2015/0221523 | A1 | 8/2015 | Zundel et al. | |

OTHER PUBLICATIONS

Gui, et al., Fabrication of Multi-Layer Substrates for High Aspect Ratio Single Crystalline Microstructures, MESA Research Institute, University of Twente, Netherlands, Journal or Conference: Sensors and Actuators, Oct. 1998.

Moran et al., Fabrication of Ultrathin Semiconductors on Insulator Structures by Materials Integration Techniques, University of Wisconsin—Madison Department of Chemical Engineering, pp. 11-15, Accessed on Jun. 10, 2015, Available at: http://www.struers.com/resources/elements/12/2461/36art3.pdf.

Parviz and Najafi., A Geometric Etch-Stop Technology for Bulk Micromachining, Center for Wireless Integrated Micro Systems, University of Michigan, Journal of Micromechanics and Microengineering, Jan. 2001, pp. 277-282.

* cited by examiner

BULK LAYER TRANSFER WAFER WITH MULTIPLE ETCH STOP LAYERS

BACKGROUND

Silicon-on-insulator (SOI) device fabrication technologies use SOI wafers to fabricate a wide variety of different high-performance and low-power semiconductor devices and circuits. An SOI wafer typically has an electrically insulating buried oxide (BOX) layer between a top portion that includes a thin layer of silicon in which transistors and other active devices are formed and a bottom bulk silicon wafer. In some examples, all of the active device and integrated circuit processing is performed on the SOI wafer. As a result of the electrical isolation between the thin silicon layer and the bulk silicon wafer, these active devices tend to operate with higher performance and lower power than comparable devices that are fabricated directly on bulk silicon wafers. In other examples, a layer transfer process is used to transfer a top active device portion of an SOI wafer to a handle wafer. In this process, the top portion of the SOI wafer is bonded to the handle wafer, and the bulk substrate and BOX layer of the SOI wafer are removed. In some examples, the handle wafer includes one or more trap rich layers between the active device layer and the bulk substrate of the handle wafer to inhibit parasitic surface conduction and enhance the RF performance of one or more devices on the handle wafer as described in, e.g., U.S. Pat. No. 8,466,036.

Although SOI wafer based device fabrication technologies offer many benefits, the high cost of SOI wafers, as compared to bulk semiconductor wafers, limits the use of these fabrication methods to only a small sub-set of the possible semiconductor device markets.

SUMMARY

In some examples, an etch stop trench is created in a top portion of a semiconductor wafer. A first etch stop material is formed in the etch stop trench. A second etch stop material is produced on the first etch stop material. A device layer is fabricated in the top portion of the semiconductor wafer. The device layer includes an active device. The semiconductor wafer is bonded to a handle wafer with the top portion of the semiconductor wafer facing the handle wafer. After the semiconductor wafer is bonded to the handle wafer, a bottom side of the semiconductor wafer is thinned to a bottom portion of the first etch stop material. After thinning the bottom side of the semiconductor wafer, the first etch stop material is selectively eliminated to a bottom portion of the second etch stop material. After selectively eliminating the first etch stop material, a bottom portion of the semiconductor wafer is removed.

In some examples, a semiconductor structure has a bulk semiconductor wafer that includes a bottom surface, a top surface, and isolation regions filled with electrically insulating material extending from the bottom surface to the top surface. At least one region of the bulk semiconductor wafer is less than 140 nanometers thick. The semiconductor structure also has a device layer that includes active devices on the semiconductor wafer. Isolation regions electrically isolate respective ones of the active devices from one another. The semiconductor structure also has one or more dielectric layers and one or more metallization layers on the device layer. The semiconductor structure also has an oxide layer on the bottom surface of the semiconductor wafer. The oxide layer has a bottom surface characterized by a surface variation of less than 5 micrometers.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Some examples that are described herein provide bonded semiconductor device structures and device structure fabrication processes to obviate the need for SOI wafers in many device fabrication applications. In some examples, multiple etch stop layers are formed in situ during fabrication of an active device structure on a bulk semiconductor wafer. The etch stop layers are incorporated into a layer transfer process to enable very thin (e.g., less than 10 nanometers thick) high quality active device layers of substantially uniform across-wafer thickness to be separated from bulk semiconductor wafers and bonded to handle wafers. In some examples, across-wafer surface variation can be reduced from approximately 2 micrometers to less than 3-4 nanometers. As a result, these examples can produce high-performance and low-power semiconductor devices while avoiding the high cost of SOI wafers.

Figure 1:
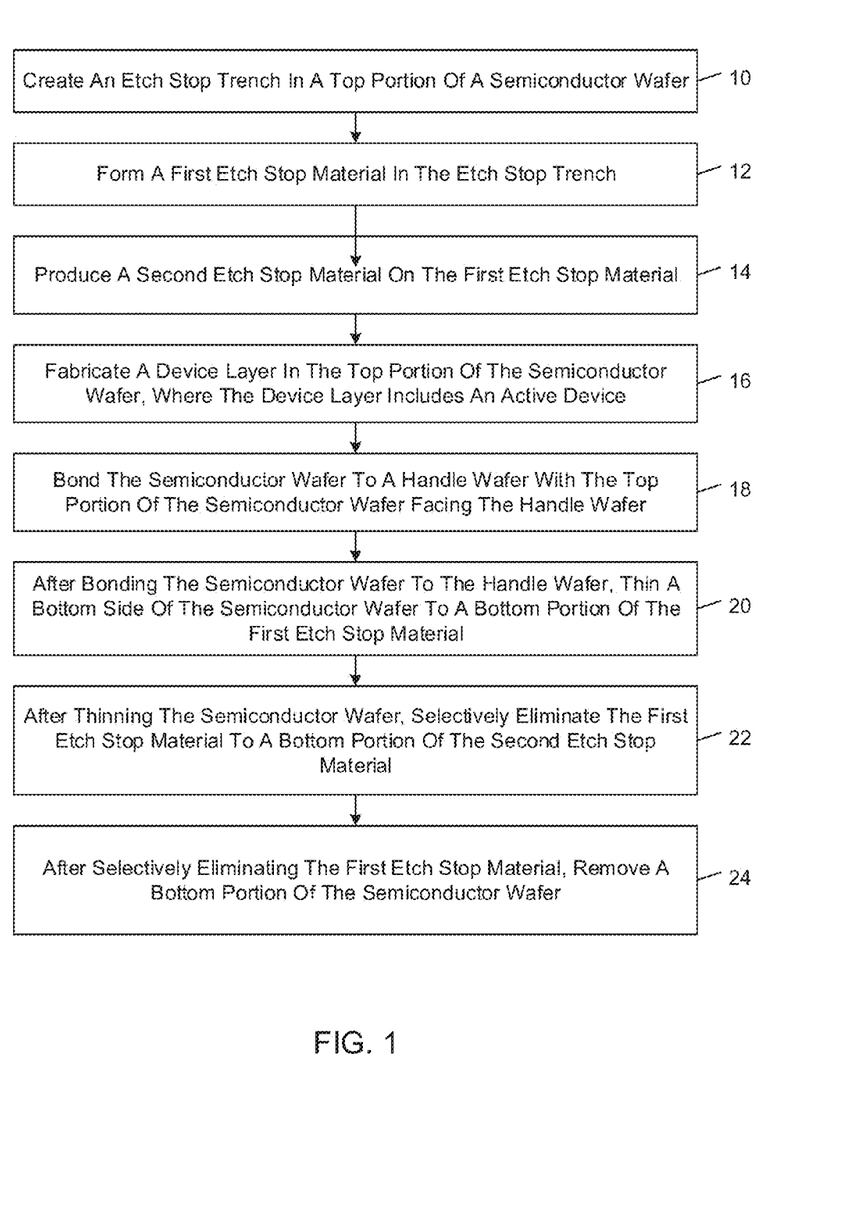
FIG. 1 is a flow diagram of an example of a method of fabricating a bonded semiconductor structure.

FIG. 1 shows an example of a method of fabricating a bonded semiconductor structure. In accordance with this method, an etch stop trench is created in a top portion of a semiconductor wafer (FIG. 1, block 10). A first etch stop material is formed in the etch stop trench (FIG. 1, block 12). A second etch stop material is produced on the first etch stop material (FIG. 1, block 14). A device layer is fabricated in the top portion of the semiconductor wafer, where the device layer includes an active device (FIG. 1, block 16). The semiconductor wafer is bonded to a handle wafer with the top portion of the semiconductor wafer facing the handle wafer (FIG. 1, block 18). After the semiconductor wafer is bonded to the handle wafer, a bottom side of the semiconductor wafer is thinned to a bottom portion of the first etch stop material (FIG. 1, block 20). After the semiconductor wafer is thinned, the first etch stop material is selectively eliminated to a bottom portion of the second etch stop material (FIG. 1, block 22). After selectively eliminating the first etch stop material, a bottom portion of the semiconductor wafer is removed (FIG. 1, block 24).

Figure 2:
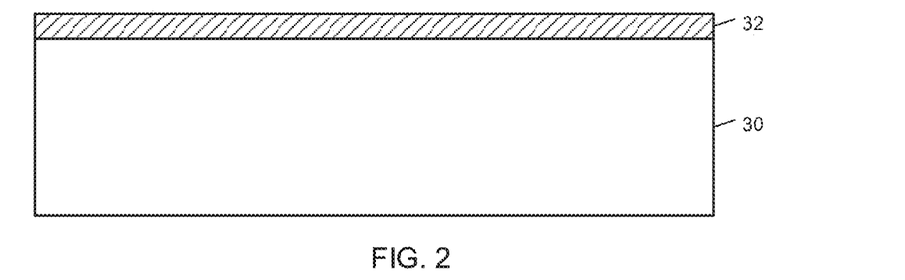
FIG. 2 is a diagrammatic view of an example of a bulk semiconductor wafer with an optional protective layer.

Referring to FIG. 2, in the method of FIG. 1, the process of fabricating the bonded semiconductor structure begins with a bulk semiconductor wafer 30, which may include an optional protective layer 32. In general, the bulk semiconductor wafer 30 may be formed of any type of semiconductor material. In the illustrated examples, the bulk semiconductor wafer 30 is a bulk silicon wafer. In general, the optional protective layer 32 may be formed using any type of protective material. In some examples, the protective layer is formed of an electrical insulator, such as an oxide (e.g., silicon dioxide), silicon nitride, or silicon carbide.

Figure 3:
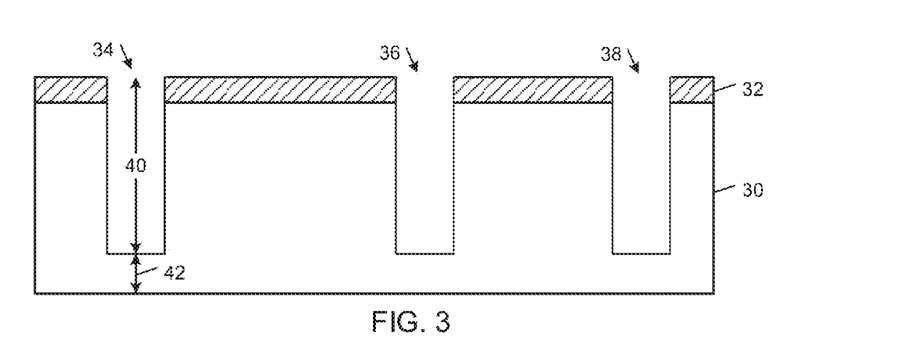
FIG. 3 is a diagrammatic view of an example of the bulk semiconductor wafer of FIG. 2 after a set of etch stop trenches have been formed in a top portion of the bulk semiconductor wafer.

Referring to FIG. 3, in the method of FIG. 1, one or more etch stop trenches 34, 36, 38 are created in a top portion of the semiconductor wafer 30 (FIG. 1, block 10). In some examples, the trenches are formed in respective isolation regions of the semiconductor wafer 30, such as shallow trench isolation (STI) regions or LOCal Oxidation of Silicon (LOCOS) isolation regions of the semiconductor wafer 30. The trenches 34-38 extend to a topside trench depth 40 that sets a corresponding first bottom-side etch stop depth 42. In some examples, the topside trench depth 40 is 2-3 micrometers. In general, the trench creation process may occur at any stage of a front-end-of-the-line (FEOL) processing sequence after the selection of the semiconductor wafer and before the deposition of metal interconnect layers. In some examples, the trenches 34-38 are formed before the isolation regions. The trenches may be created in a variety of different ways, including by a variety of different dry etching techniques, wet etching techniques, and combinations of such techniques. In some examples, the trenches 34-38 are created using conventional STI fabrication techniques.

Figure 4A:
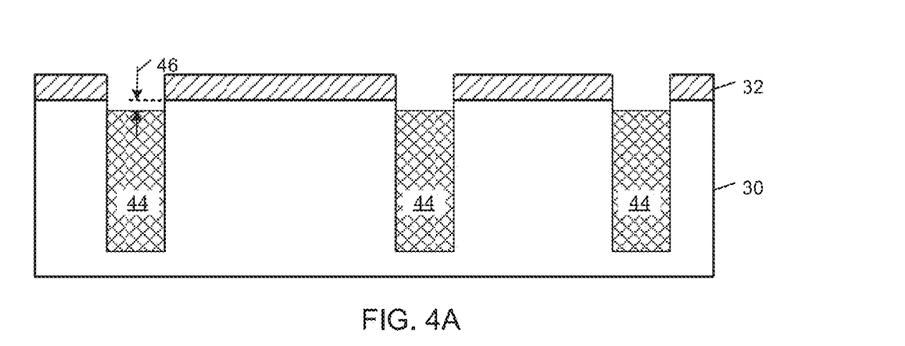
FIG. 4A is a diagrammatic view of an example of the bulk semiconductor wafer of FIG. 3 after an etch stop material has been formed in the etch stop trenches.

As shown in FIG. 4A, in some examples, after the one or more etch stop trenches 34-38 have been created, a first etch stop material 44 is formed in the one or more etch stop trenches 34-38 (FIG. 1, block 12). The first etch stop material 44 acts as an etch stop with respect to the bulk semiconductor wafer 30. In the illustrated examples, the semiconductor wafer 30 has a high etch rate relative to the first etch stop material 44 with respect to a target semiconductor wafer etching process. In examples in which the semiconductor wafer 30 is a bulk silicon wafer, the first etch stop material 44 may be formed of, for example, silicon nitride (SiN), poly silicon-germanium (SiGe), or silicon boron germanium (Si(B)Ge). The first etch stop material 44 typically is formed using a high aspect ratio fill process. After the first etch stop material 44 is formed, a surface smoothing process (e.g., chemical mechanical polishing/planarization (CMP)) typically is performed to remove the first etch stop material 44 from the surface of the protective layer 32 and to recess the first etch stop material 44 to a depth 46 below the top surface of the semiconductor wafer 30. In some examples, the depth 46 will be less than the specified depth of the isolation (e.g., STI) regions.

Figure 4B:
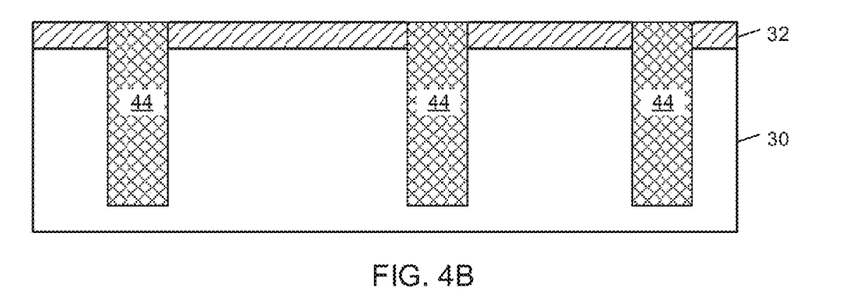
FIG. 4B is a diagrammatic view of an alternative example of the bulk semiconductor wafer of FIG. 3 after an etch stop material has been formed in the etch stop trenches.

FIG. 4B shows an alternative example of the structure shown in FIG. 3, in which the first etch stop material 44 is formed in the one or more etch stop trenches 34-38 (FIG. 1, block 12). A surface smoothing process (e.g., chemical mechanical polishing/planarization (CMP)) typically is performed after the first etch stop material 44 is formed to remove the first etch stop material 44 from the surface of the protective layer 32 but, in contrast with the example shown in FIG. 4A, the first etch stop material 44 is only etched to the top surface of the protective layer 32. not etched to a depth below the top surface of the semiconductor wafer 30.

Figure 5A:
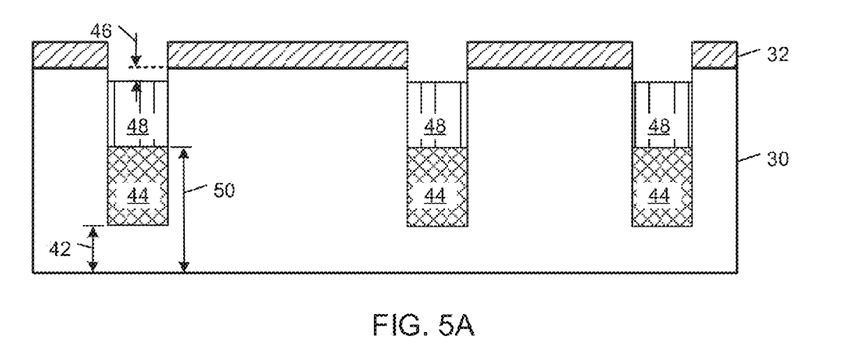
FIG. 5A is a diagrammatic view of an alternative example of the bulk semiconductor wafer of FIG. 3 after two different etch stop materials have been formed in the etch stop trenches.

FIG. 5A shows an alternative example in which each of the one or more trenches 34-38 is filled with different etch stop materials 44, 48 that establish different respective bottom-side etch stop depths 42, 50 to increase the across-wafer uniformity of the active device layer that can be separated from the bulk semiconductor wafer 30 in a layer separation process. Although only two types of material are illustrated, any number of different etch stop materials can be utilized in keeping with these examples. In the illustrated example, the semiconductor wafer 30 has a high etch rate relative to the first etch stop material 44 and the second etch stop material with respect to at least one target semiconductor wafer etching process. In addition, the first etch stop material 44 has a high etch rate relative to the second etch stop material 48 with respect to a target process for etching the first etch stop material 44. As described above in connection with the example shown in FIG. 4A, after the second etch stop material 48 is formed, a surface smoothing process (e.g., chemical mechanical polishing/planarization (CMP)) typically is performed to remove the second etch stop material 48 from the surface of the protective layer 32 and to recess the second etch stop material 48 to a depth 46 below the top surface of the semiconductor wafer 30, which is again, in some examples, less than the specified depth of the isolation (e.g., STI) regions (described below).

Figure 5B:
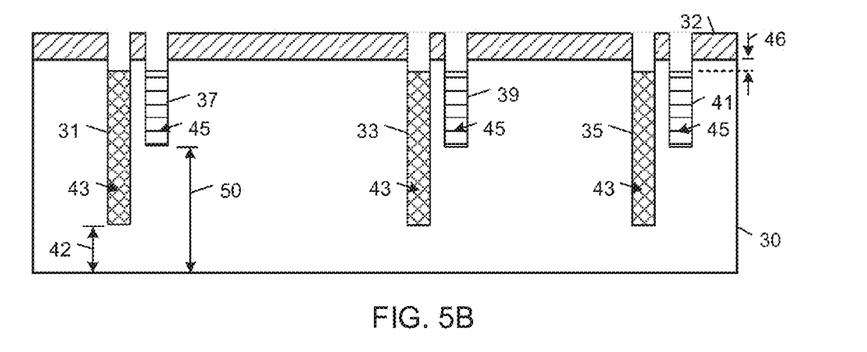
FIG. 5B is a diagrammatic view of an alternative example of the bulk semiconductor wafer of FIG. 3 after two sets of etch stop trenches have been formed and filled with different etch stop materials.

FIG. 5B shows an alternative example in which two sets of trenches 31, 33, 35 and 37, 39, 41 are respectively filled with different etch stop materials 43, 45 to establish different respective bottom-side etch stop depths 42, 50 that can be used to increase the across-wafer uniformity of the active device layer that can be separated from the bulk semiconductor wafer 30 in a layer separation process. Although only two types of trenches are illustrated, any number of different types of trenches can be utilized in keeping with these examples. In the illustrated example, the semiconductor wafer 30 has a high etch rate relative to the first etch stop material 43 and the second etch stop material 45 with respect to at least one target semiconductor wafer etching process. In addition, the first etch stop material 43 has a high etch rate relative to the second etch stop material 45 with respect to a target process for etching the first etch stop material 43. As described above in connection with the example shown in FIG. 4A, after the second etch stop material 45 is formed, a surface smoothing process (e.g., chemical mechanical polishing/planarization (CMP)) typically is performed after each of the first and second sets of trenches 31-35 and 37-41 are formed and respectively filled with the first and second etch stop materials 43, 45 to remove the first and second etch stop materials 43, 45 from the surface of the protective layer 32 and to recess the first and second etch stop materials 43, 45 to a depth 46 below the top surface of the semiconductor wafer 30, which is again, in some examples, less than the specified depth of the isolation (e.g., STI) regions (described below).

Figure 6A:
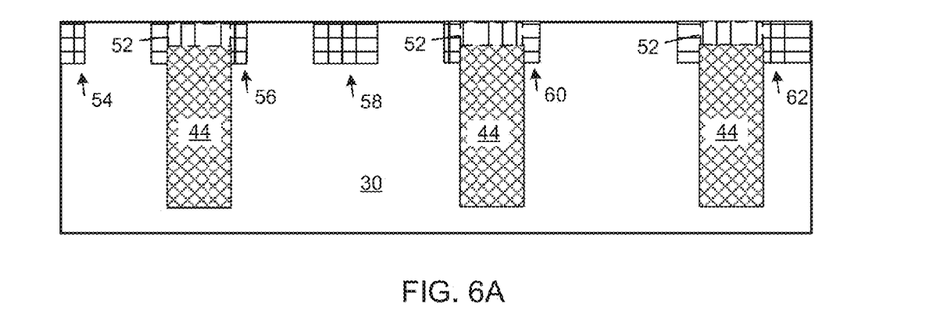
FIG. 6A is a diagrammatic view of an example of the bulk semiconductor wafer of FIG. 4A after isolation regions have been formed in the top portion of the bulk semiconductor wafer.

Referring to FIG. 6A, in some examples, after the first etch stop material 44 is formed in the one or more trenches 34-38 in the example shown in FIG. 4A, a second or "top" etch stop material 52 is produced on the first etch stop material 44 in the one or more etch stop trenches (FIG. 1, block 14). The semiconductor wafer 30 has a high etch rate relative to the top etch stop material 52 with respect to a target semiconductor wafer etching process, and the first etch stop material 44 has a high etch rate relative to the top etch stop material 52 with respect to a target process for etching the first etch stop material 44. In some examples, the top etch stop material 52 is formed of an oxide, such as silicon dioxide. In the illustrated example, the top etch stop material 52 is produced during the fabrication of isolation regions 54, 56, 58, 60, 62 (e.g., STI regions). The etch stop material 52 and the material used to form the isolation regions 54-62 may be the same or different. During this process, the protective layer 32 typically is removed, as shown in FIG. 6A. In the illustrated example, the isolation regions 54-62 extend laterally beyond the lateral extent of the top etch stop material 52; in other examples, the lateral extents of the isolation regions 54-62 and the etch stop material 52 are the same.

Figure 6B:
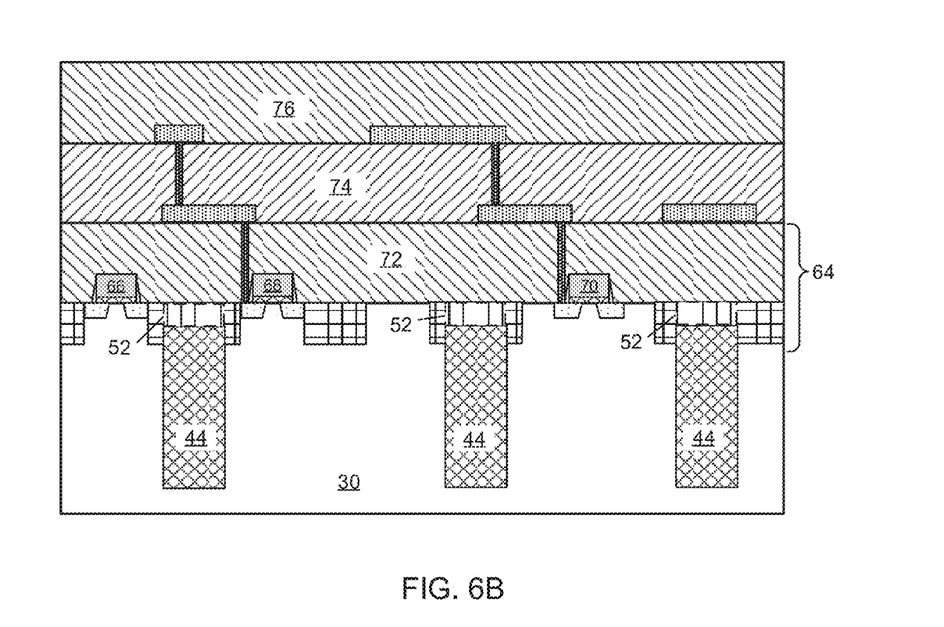
FIG. 6B is a diagrammatic view of an example of the bulk semiconductor wafer of FIG. 6A after an active device layer and two metallization layers have been fabricated.

Referring to FIG. 6B, in the illustrated example, after the isolation regions 54-62 have been formed, an active device layer 64 is formed in the top portion of the bulk semiconductor wafer 30. The active device layer 64 includes several active devices 66, 68, 70, passive devices (not shown), and an overlying dielectric layer 72, such as tetraethyl orthosilicate (TEOS), or contact glass. The active device layer 64 also includes vias through which metal interconnects extend to connect the underlying active and passive devices to overlying metallization layers 74, 76 and other on-chip devices and off-chip devices. Additional interconnect layers (not shown) also may be formed.

Figure 7A:
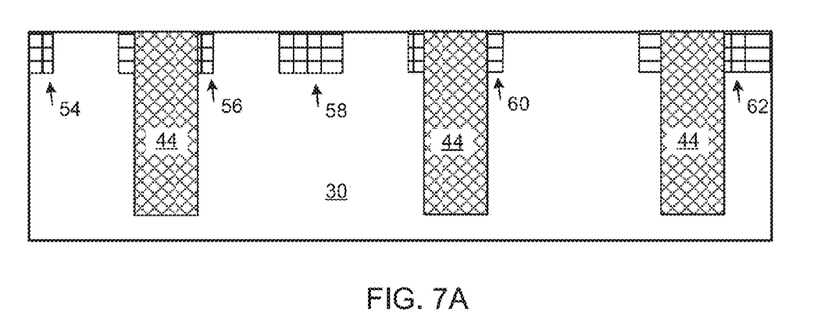
FIG. 7A is a diagrammatic view of an example of the bulk semiconductor wafer of FIG. 4B after isolation regions have been formed in the top portion of the bulk semiconductor wafer.

Referring to FIG. 7A, in some examples, after the protective layer 32 typically is removed, one or more isolation regions 54, 56, 58, 60, 62 (e.g., STI regions) are formed in the structure shown in FIG. 4B. In the illustrated example, the one or more trenches containing the first etch stop material 44 are located in regions that coincide with the isolation regions 56, 60, 62; in other examples, the trenches may be laterally offset from the locations of the isolation regions. In the illustrated example, the isolation regions 54-62 extend laterally beyond the lateral extent of the top etch stop material 52; in other examples, the lateral extents of the isolation regions 54-62 and the etch stop material 52 are the same.

Figure 7B:
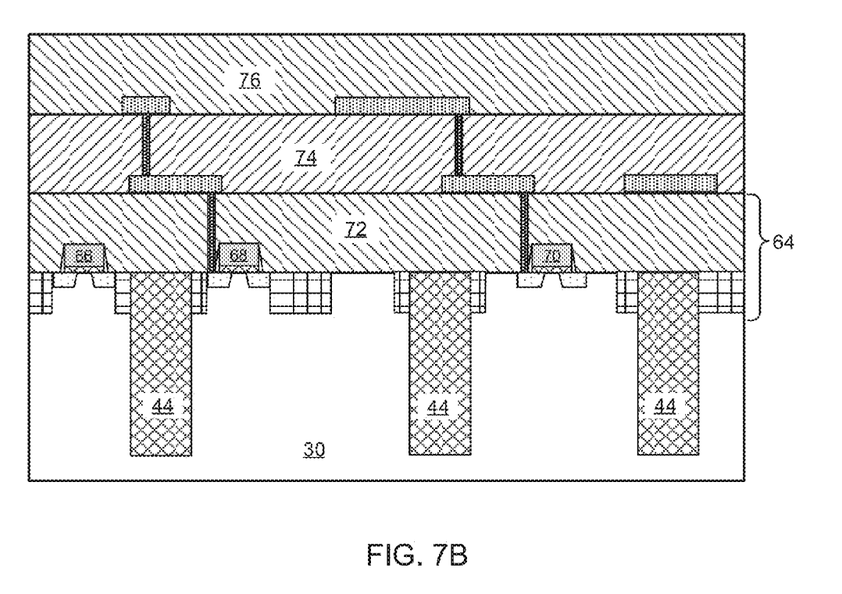
FIG. 7B is a diagrammatic view of an example of the bulk semiconductor wafer of FIG. 7A after an active device layer and two metallization layers have been fabricated.

Referring to FIG. 7B, in the illustrated example, after the isolation regions 54-62 have been formed, an active device layer 64 is formed in the top portion of the bulk semiconductor wafer 30. The active device layer 64 includes several active devices 66, 68, 70, passive devices (not shown), and an overlying dielectric layer 72, such as tetraethyl orthosilicate (TEOS), an oxide (e.g., silicon dioxide), or contact glass. In this example, the overlying dielectric layer 72 serves as a second etch stop during the process of removing the first etch stop material 44 described below in connection with FIG. 10. For this purpose, the first etch stop material 44 has a high etch rate relative to the overlying dielectric layer 72 with respect to a target process for etching the first etch stop material 44. The active device layer 64 also includes vias through which metal interconnects extend to connect the underlying active and passive devices to overlying metallization layers 74, 76 and other on-chip devices and off-chip devices. Additional interconnect layers (not shown) also may be formed.

Figure 8:
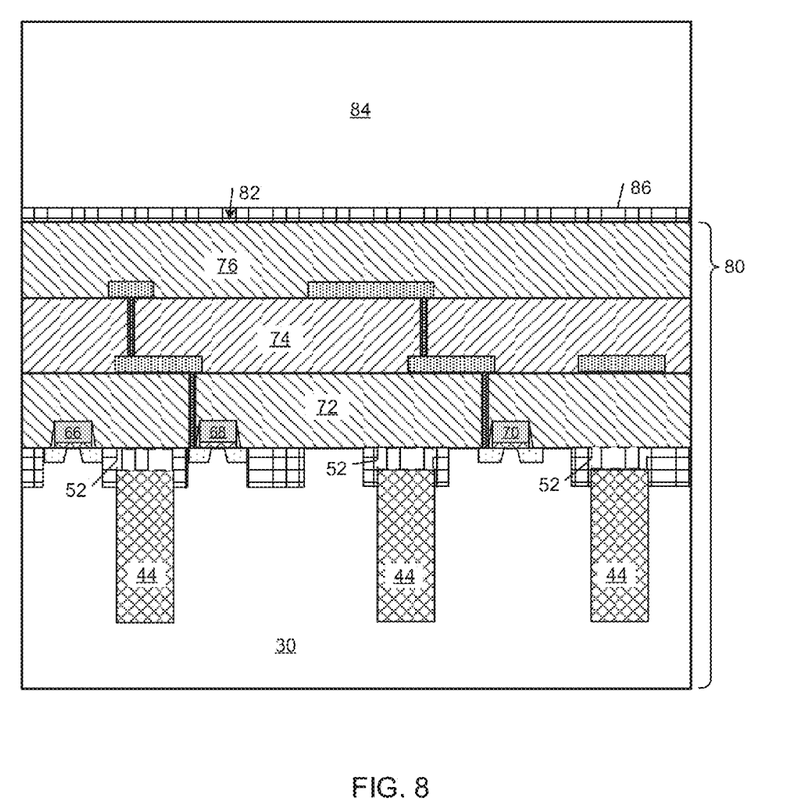
FIG. 8 is a diagrammatic view of an example of a bonded semiconductor structure formed from the bulk semiconductor wafer of FIG. 6A and a handle wafer.

Referring to FIG. 8, after the active and passive devices and structures have been formed on the semiconductor wafer 30, the resulting semiconductor structure 80 may then be bonded to a top surface 82 of a handle wafer 84 as part of a process to transfer the top portion of the semiconductor structure 80 to the handle wafer 84 (FIG. 1, block 16).

The handle wafer 84 typically is a bulk semiconductor wafer (e.g., a silicon wafer) that may or may not include additional layers and structures. In some examples, the handle wafer 84 includes one or more structures (e.g., cavities and other structural features) and one or more trap rich layers (TRLs) that inhibit parasitic surface conduction in the handle wafer 84 to enhance the RF performance of devices formed in the semiconductor structure 80. Briefly, the one or more TRLs reduce nonlinear parasitic capacitance and parasitic surface conduction in the handle wafer substrate. The one or more structures, on the other hand, further reduce the impact of non-linear responses in the handle wafer substrate by reducing the permittivity and increasing the resistivity between the one or more devices and the handle wafer substrate to reduce capacitive interactions between the one or more devices and the handle wafer substrate. Additional details regarding the structure and operation of the TRLs and permittivity reducing and resistivity increasing structures are described in U.S. patent application Ser. No. 14/633,024, filed Feb. 26, 2015, which is incorporated herein by reference.

The top surface 82 of the handle wafer 84 typically is bonded to the top portion of the semiconductor structure 80 using wafer bonding or one or more other layer transfer techniques. In some examples, the handle wafer 84 includes on its top surface 82 an exposed bonding layer 86 that is used to bond the handle wafer 84 to the top surface of the semiconductor structure 80. The bonding layer 86 may be formed from one or more insulator layers and passivation layers. In some examples, the bonding layer is an oxide layer that is formed by chemical vapor deposition (CVD) or thermal oxidation.

Figure 9:
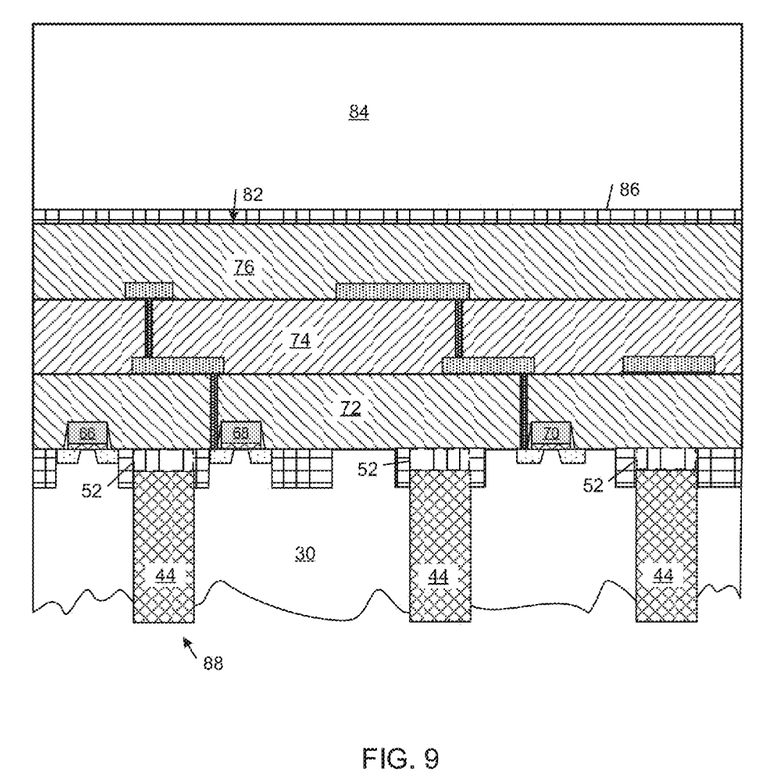
FIG. 9 is a diagrammatic view of an example of the bonded semiconductor structure of FIG. 8 after a bulk semiconductor wafer thinning process stage.

Referring to FIG. 9, after bonding the semiconductor wafer 30 to the handle wafer 84, a bottom side of the bulk semiconductor wafer 30 is thinned to a bottom portion 88 of the first etch stop material 44. In some examples, a thinning process (e.g., mechanical grinding, mechanical polishing, rapid wet etch, plasma etch, chemical-mechanical polish, or other wafer thinning process) is used to thin the bottom substrate portion of the semiconductor wafer 80. The thinning process may involve, for example, a combination of any of the above-mentioned thinning processes as needed to improve the uniformity of the semiconductor substance 30. In some examples, the bottom substrate portion is thinned using a combination of mechanical wafer grinding followed by a plasma or wet etch, such as a TMAH (Tetramethylammonium Hydroxide) wet etch, which has a high selectivity to the first etch stop material (e.g., silicon nitride (SiN), poly silicon-germanium (SiGe), or silicon boron germanium (Si(B)Ge)) such that it etches the undoped bulk silicon substrate and effectively stops on the bottom portion of the first etch stop material 44.

Figure 10:
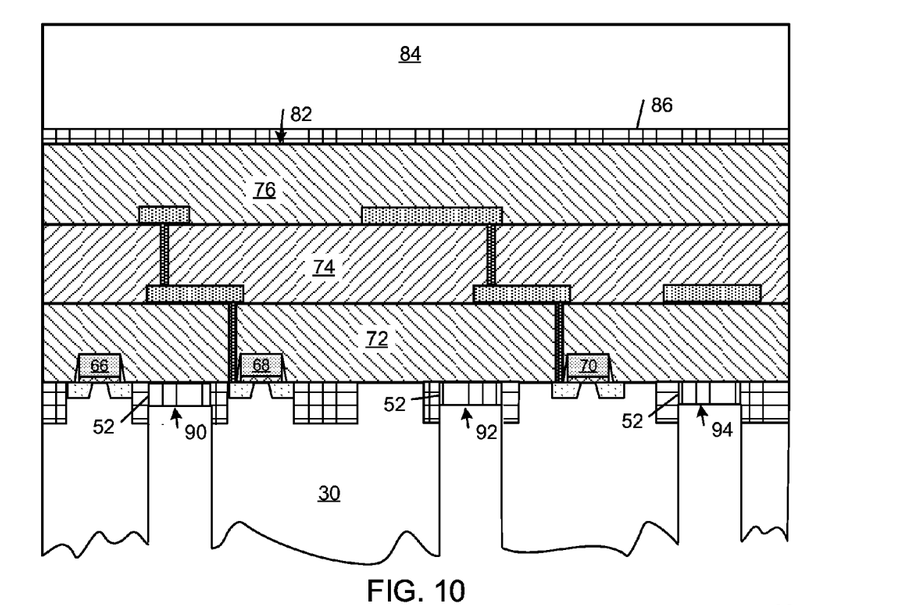
FIG. 10 is a diagrammatic view of the bonded semiconductor structure of FIG. 9 after a first etch stop removal process.

As shown in FIG. 10, after thinning the bottom side of the bulk semiconductor wafer 30, the first etch stop material 44 is selectively eliminated. In examples of the type shown in FIGS. 6A-6B, the first etch stop material 44 is selectively eliminated to a bottom portion 90, 92, 94 of the top etch stop material 52. In examples of the type shown in FIGS. 7A-7B, the first etch stop material 44 is selectively eliminated to a bottom portion of the dielectric material 72 in the active device layer 64. In some examples, an etch process that has a high selectivity to the bulk semiconductor wafer 30 and the overlying etch stop material is used to selectively remove the first etch stop material 52. In examples in which the bulk semiconductor substrate 30 is silicon, the overlying etch stop material can be silicon dioxide and the first etch stop material 44 can be silicon nitride, a dry discharge gas based etching process that includes a mixture of oxygen and nitrogen gases and small amounts of a fluorine source may be used to selectively etch the silicon nitride etch stop material 44.

Figure 11:
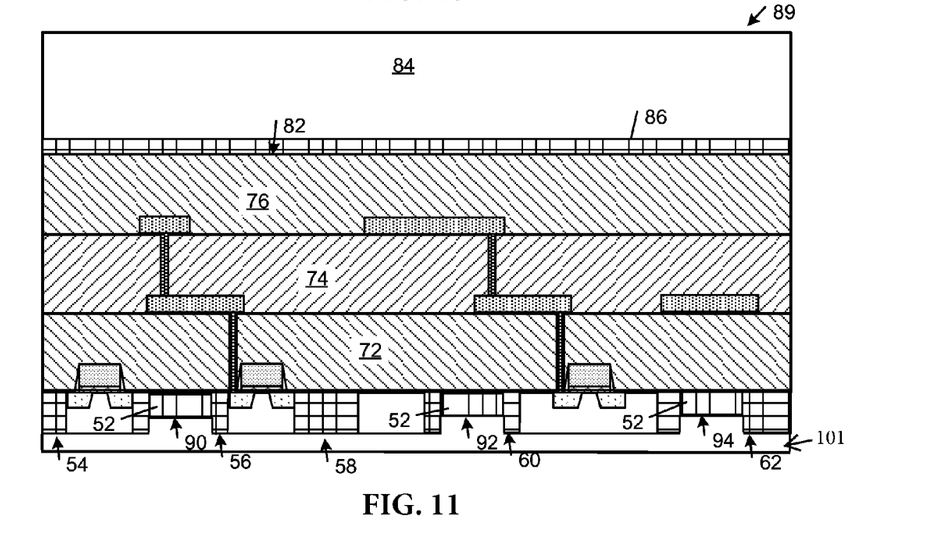
FIG. 11 is a diagrammatic view of the bonded semiconductor structure of FIG. 10 after a bulk semiconductor wafer removal process stage.

Referring to FIG. 11, after eliminating the first etch stop material 44, a bottom portion of the bulk semiconductor wafer 30 is removed. In some examples, the bulk semiconductor wafer 30 is removed down to the isolation regions 54, 56, 58, 60, 62 (e.g., STI regions). In other examples, the bulk semiconductor wafer 30 is removed to the bottom of the top etch stop material 52. In general, a variety of different etching processes may be used to selectively remove the bulk semiconductor wafer 30. In examples in which the bulk semiconductor wafer 30 is silicon and the isolation regions 54-62 are silicon dioxide, a chemical mechanical polishing/planarization process is used to selectively remove the bulk silicon substrate down to a depth corresponding to the bottommost surfaces of the isolation regions 54-62.

In some examples, the resulting semiconductor structure 89 includes a bottom surface, a top surface, and isolation regions filled with electrically insulating material extending from the bottom surface to the top surface, with at least one region of the bulk semiconductor wafer being less than 140 nanometers thick. The resulting semiconductor structure 89 also includes a device layer that includes active devices on the semiconductor wafer and isolation regions that electrically isolate respective ones of the active devices from one another. The resulting semiconductor structure 89 further includes one or more dielectric layers and one or more metallization layers on the device layer, and an oxide layer 101 on the bottom surface of the semiconductor wafer. The oxide layer 101 typically has a bottom surface characterized by a surface variation of less than 5 micrometers. In some of these examples, the resulting semiconductor wafer 30 has a thickness less than 10 nanometers in regions where the bottom portion of the semiconductor wafer is removed.

In some examples, after the bulk semiconductor wafer 30 has been selectively removed, a passivation layer (e.g., a dielectric insulator layer) is formed over the exposed bottom side of the resulting semiconductor structure 89. The passivation layer typically is smoothed. In some of these examples, the bottom surface of the passivation layer is characterized by a surface variation of less than 5 micrometers. In some examples, across-wafer passivation layer surface variation can be reduced from approximately 2 micrometers to less than 3-4 nanometers.

In some examples, contacts for the active devices 66-70 are formed on the exposed bottom side of the top portion of the bulk semiconductor wafer 30. For example, with reference to FIG. 10, contacts can be formed by etching through isolation regions or the bottom portion 90, 92, 94 of the top etch stop material 52, to the metallization layers 74 or 76.

Figure 12:
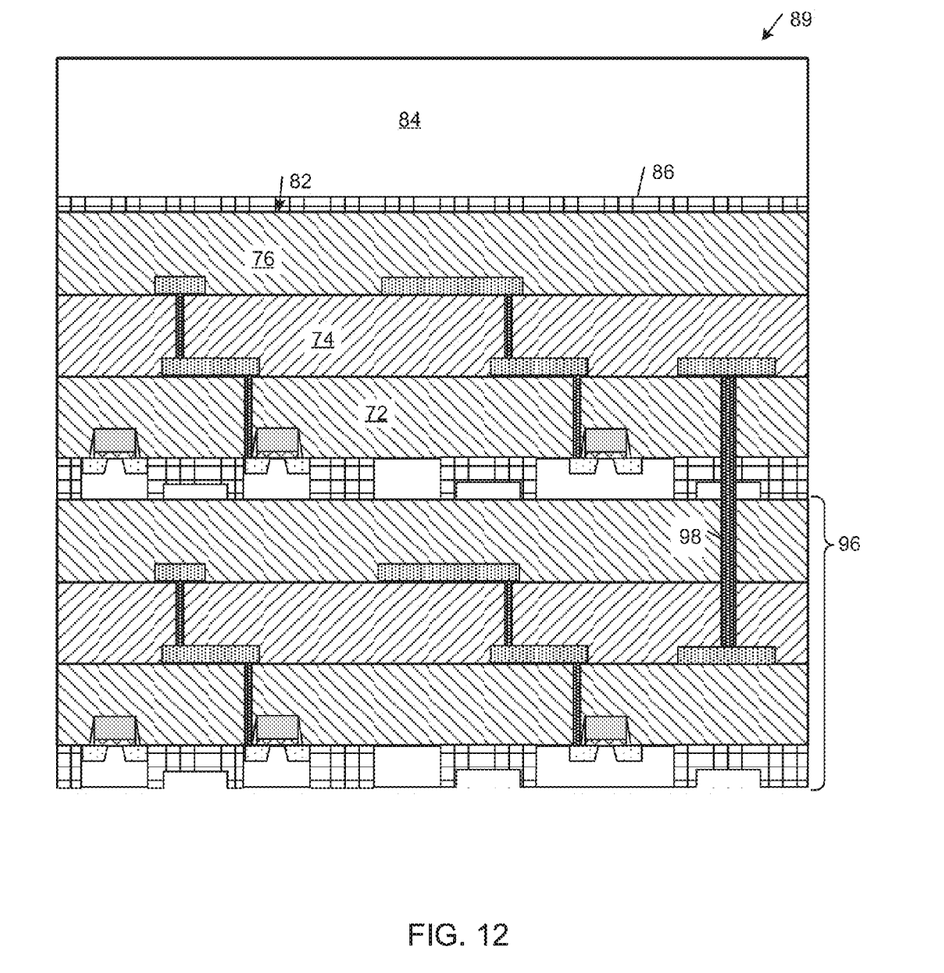
FIG. 12 is a diagrammatic view of the bonded semiconductor structure of FIG. 11 after a layer transfer process.

As shown in FIG. 12, in some examples, one or more additional transfer layers 96 may be bonded to the resulting semiconductor structure 89. In addition, one or more through-vias 98 may be used to interconnect the metallization layers of different transfer layers. In certain approaches, the through-vias 98 will be aligned with the original trenches formed from the top surface of each wafer. Any number of additional layers can be added using this process as the structure that results from the addition of another layer can be treated as the handle wafer for the next iteration of the process.

What is claimed is:

1. A method, comprising:
   creating an etch stop trench in a top portion of a semiconductor wafer;
   forming a first etch stop material in the etch stop trench;
   producing a second etch stop material on the first etch stop material;
   fabricating a device layer in the top portion of the semiconductor wafer, wherein the device layer comprises an active device;
   bonding the semiconductor wafer to a handle wafer with the top portion of the semiconductor wafer facing the handle wafer;
   after the bonding, thinning a bottom side of the semiconductor wafer to a bottom portion of the first etch stop material;
   after the thinning, selectively eliminating the first etch stop material to a bottom portion of the second etch stop material; and
   after the eliminating, removing a bottom portion of the semiconductor wafer.

2. The method of claim 1, wherein the etch stop trench is formed in an isolation region of the semiconductor wafer.

3. The method of claim 2, wherein the second etch stop material comprises an electrically insulating material that electrically isolates the active device from another active device in the device layer.

4. The method of claim 2, further comprising:
   after the producing, forming electrically insulating material in the isolation region to electrically isolate the active device from another active device in the device layer.

5. The method of claim 2, wherein the isolation region extends a first depth below a top surface of the semiconductor wafer, and the forming comprises recessing the first etch stop material below the top surface of the semiconductor wafer to a second depth that is less than the first depth.

6. The method of claim 1, wherein the second etch stop material is a dielectric material in an active device layer formed in the top portion of the semiconductor wafer.

7. The method of claim 1, wherein the thinning comprises at least two selected from the group consisting of mechanical grinding, chemical mechanical polishing, and wet etching.

8. The method of claim 1, wherein the selectively eliminating comprises selectively etching the first etch stop material with an etchant that etches the first etch stop material at a higher rate than the semiconductor wafer.

9. The method of claim 1, wherein the removing comprises chemical mechanical polishing the bottom portion of the semiconductor wafer.

10. The method of claim 1, wherein the fabricating is performed after the second etch stop material is produced on the first etch stop material.

11. The method of claim 10, wherein the fabricating is performed before the semiconductor wafer is bonded to the handle wafer.

12. The method of claim 1, further comprising constructing one or more dielectric layers and one or more metallization layers on the device layer.

13. The method of claim 12, wherein the fabricating comprises fabricating multiple active devices on the top portion of the semiconductor wafer, and at least one of the one or more metallization layers interconnects respective ones of the active devices.

14. The method of claim 1, wherein the creating comprises creating multiple etch stop trenches in the top portion of the semiconductor wafer, and the forming and the producing are respectively performed with respect to each of the one or more etch stop trenches.

15. The method of claim 1, wherein the semiconductor wafer is a bulk semiconductor wafer.

16. The method of claim 1, wherein the semiconductor wafer is a bulk silicon wafer.

17. The method of claim 1, wherein the creating comprises creating the etch stop trench with a depth of 1-2 micrometers below a top surface of the semiconductor wafer.

18. The method of claim 1, wherein:
after the removing, the semiconductor wafer has a thickness less than 140 nanometers where the bottom portion of the semiconductor wafer is removed.

19. The method of claim 1, wherein:
after the removing, the semiconductor wafer has a thickness less than 10 nanometers where the bottom portion of the semiconductor wafer is removed.

20. The method of claim 1, further comprising:
after the removing, forming an insulator layer on a bottom surface of the semiconductor wafer and smoothing the insulator layer;
wherein, after the smoothing, the insulator layer has a bottom surface characterized by a surface variation of less than 5 micrometers.

21. A semiconductor structure, comprising:
a bulk semiconductor wafer comprising a bottom surface, a top surface, and isolation regions filled with electrically insulating material extending from the bottom surface to the top surface, wherein at least one region of the bulk semiconductor wafer is less than 140 nanometers thick;
a device layer comprising active devices on the bulk semiconductor wafer, wherein isolation regions electrically isolate respective ones of the active devices from one another; one or more dielectric layers and one or more metallization layers on the device layer; and
an oxide layer on the bottom surface of the bulk semiconductor wafer, wherein the oxide layer has a bottom surface characterized by a surface variation of less than 5 micrometers, wherein each of the isolation regions comprises a shallow trench isolation region extending to a first depth and an insulator region within the shallow trench isolation region extending to a second depth less than the first depth, further wherein the oxide layer contacts the insulator region.

22. The semiconductor structure of claim 21, wherein the at least one region of the bulk semiconductor wafer is less than 10 nanometers thick.

* * * * *